United States Patent
An et al.

(10) Patent No.: US 8,115,555 B2
(45) Date of Patent: Feb. 14, 2012

(54) BALUN FUNCTION WITH REFERENCE ENHANCEMENT IN SINGLE-ENDED PORT

(75) Inventors: Kyu Hwan An, Irvine, CA (US); Yunseo Park, Norcross, GA (US); Chang-Ho Lee, Marietta, GA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 133 days.

(21) Appl. No.: 12/722,966

(22) Filed: Mar. 12, 2010

(65) Prior Publication Data
US 2011/0221528 A1      Sep. 15, 2011

(51) Int. Cl.
*H03F 3/04* (2006.01)
(52) U.S. Cl. .................. 330/301; 330/195; 330/116
(58) Field of Classification Search .................. 330/301, 330/195, 116
See application file for complete search history.

(56) References Cited

U.S. PATENT DOCUMENTS

| | | | |
|---|---|---|---|
| 4,150,377 A * | 4/1979 | Milov et al. | 342/125 |
| 5,930,124 A | 7/1999 | Otake | |
| 6,414,547 B1 * | 7/2002 | Shkap | 330/254 |
| 7,057,971 B2 * | 6/2006 | Notthoff | 365/242 |
| 7,843,272 B2 * | 11/2010 | Yamaguchi | 330/301 |
| 7,890,069 B2 * | 2/2011 | Kyranas et al. | 455/141 |
| 7,940,152 B1 * | 5/2011 | Kim et al. | 336/180 |
| 7,944,296 B1 * | 5/2011 | Lee et al. | 330/195 |
| 2009/0174477 A1 | 7/2009 | Lee et al. | |

FOREIGN PATENT DOCUMENTS

KR      1020090075641 A      7/2009

OTHER PUBLICATIONS

Office Action from Korean Application No. KR10-2010-0110927 dated Sep. 29, 2011.

* cited by examiner

*Primary Examiner* — Patricia Nguyen

(57) ABSTRACT

Systems and methods are provided for a transformer or balun function with reference enhancement. The systems and methods may include a transformer having at least a primary winding and a secondary winding for reference enhancement, where the primary winding includes a center tap, where the secondary winding includes a first port and a second port, and an electrical connection that electrically connects the second port and the center tap of the primary winding to provide a common reference for the primary winding and the secondary winding. The primary winding of the transformer may be configured to receive differential outputs of a power amplifier, and the transformer may be configured to convert the differential outputs from a balanced signal to an unbalanced signal available at the first port of the secondary winding.

20 Claims, 5 Drawing Sheets

BALUN FUNCTION WITH REFERENCE ENHANCEMENT IN SINGLE-ENDED PORT

FIELD OF INVENTION

Embodiments of the invention relate generally to a balun, and more particularly, to a balun function with reference enhancement in a single-ended port.

BACKGROUND OF THE INVENTION

In CMOS integrated circuits, the design of functional blocks are often designed in a differential form due to the imperfect ground reference lacking a thru via from the top layer to the backside of CMOS substrate. Therefore, a single-ended block, for example, an RF power amplifier, requires conversions from a single-ended port to differential ports or differential ports to a single-ended port, often represented balanced-to-unbalanced (balun). Since the conversion mainly comes from the magnetic coupling from the balanced ports to the unbalanced port, the conversion does not share the same reference. In an output matching of a power amplifier, a vaguely defined reference of the unbalanced output port often causes the loss of the balun conversion. Therefore, a reference enhancement at the unbalanced output port is desirable to minimize the loss of conversion, in other words, to enhance the efficiency in the power amplifier.

FIG. 1 illustrates a block diagram of a conventional power amplifier system 100 with a transformer output matching. In FIG. 1, a transformer 107 is oftentimes used at the output of a CMOS power amplifier (PA) 101 for impedance matching and balun function. While the function of impedance matching helps provide high output generation at the output port, the additional balanced-to-unbalanced conversion often generates more loss. The loss does not come only from the quality factor of the transformer 107, but also from the lack of an exact common reference for the unbalanced port.

FIG. 2 illustrates an impact of noise in a conventional power amplifier system 200. As shown in FIG. 2, the convention transformer 220 has a primary winding 204 and a secondary winding 205. The conventional transformer 220 has a first reference point 206 in the primary winding 204 and a second reference point 207 in the secondary winding 205. Parasitic elements 208, 209, 210 can form an imperfect and inconsistent parasitic network that allows some limited communication between the first reference point 206 and the second reference point 207. However, the references points 206, 207 are not guaranteed that to be equal in electrical reference levels due to the imperfect and inconsistent parasitic network provided parasitic elements 208, 209, 210. Indeed, if any noise 212, 214 is present on both reference points 206, 207, the coupling between the primary winding 204 and the secondary winding 205 fluctuates, as shown by a comparison of PA output signal 206 and transformer output signal 213. The fluctuation in coupling is more severe in large signal operation like a power amplifier with bonding wires for imperfect reference.

BRIEF SUMMARY OF THE INVENTION

According to an example embodiment of the invention, there is a power amplifier system. The power amplifier system may include a power amplifier having differential outputs; a transformer having at least a primary winding and a secondary winding, where the primary winding is connected to differential outputs of the power amplifier, where the primary winding includes a center tap, where the secondary winding that includes a first port and a second port, the first port for providing a system output; and an electrical connection that connects the center tap of the primary winding with the second port of the secondary winding.

According to another example embodiment of the invention, there is a method. The method may include configuring a transformer having at least a primary winding and a secondary winding for reference enhancement, where the primary winding includes a center tap, where the secondary winding includes a first port and a second port, where the configuration includes electrically connecting the second port and the center tap of the primary winding to provide a common reference for the reference enhancement; receiving differential outputs of a power amplifier by the primary winding of the transformer; and converting, by the transformer, the differential outputs from a balanced signal to an unbalanced signal available at the first port of the secondary winding.

According to another example embodiment of the invention, there is another system. The system may include configuring a transformer having at least a primary winding and a secondary winding for reference enhancement, where the primary winding includes a center tap, where the secondary winding includes a first port and a second port, where the configuration includes electrically connecting the second port and the center tap of the primary winding to provide a common reference for the reference enhancement; receiving differential outputs of a power amplifier by the primary winding of the transformer; and converting, by the transformer, the differential outputs from a balanced signal to an unbalanced signal available at the first port of the secondary winding.

BRIEF DESCRIPTION OF THE DRAWINGS

Figure 1:
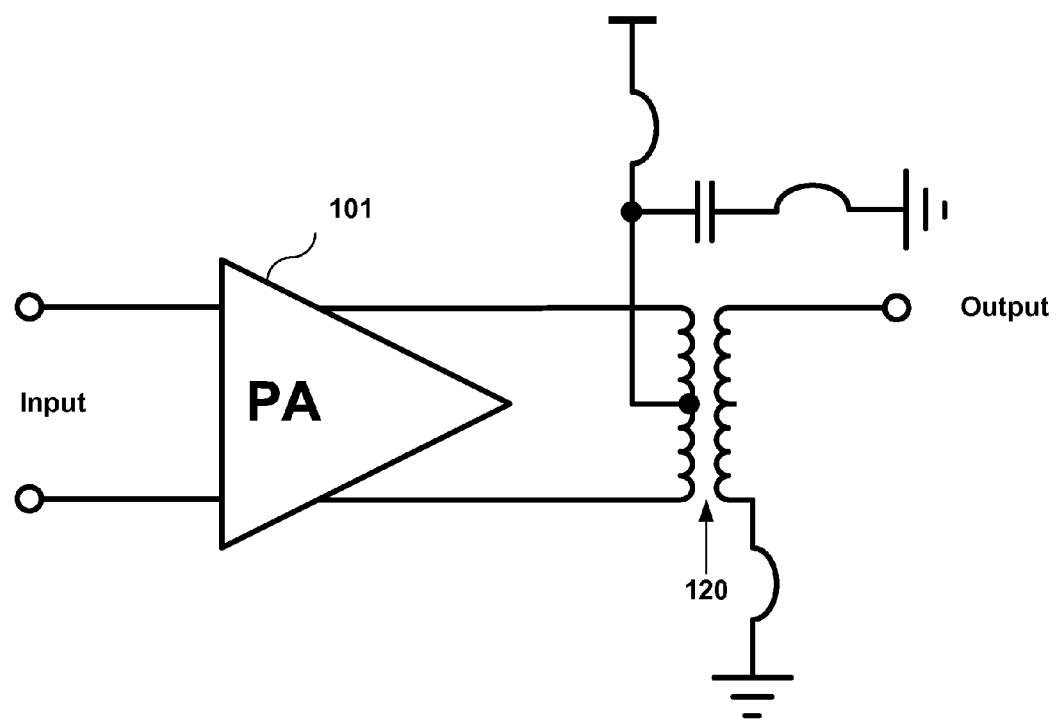

Having thus described the invention in general terms, reference will now be made to the accompanying drawings, which are not necessarily drawn to scale, and wherein:

FIG. 1 illustrates a block diagram of a conventional power amplifier system with a transformer output matching.

Figure 2:
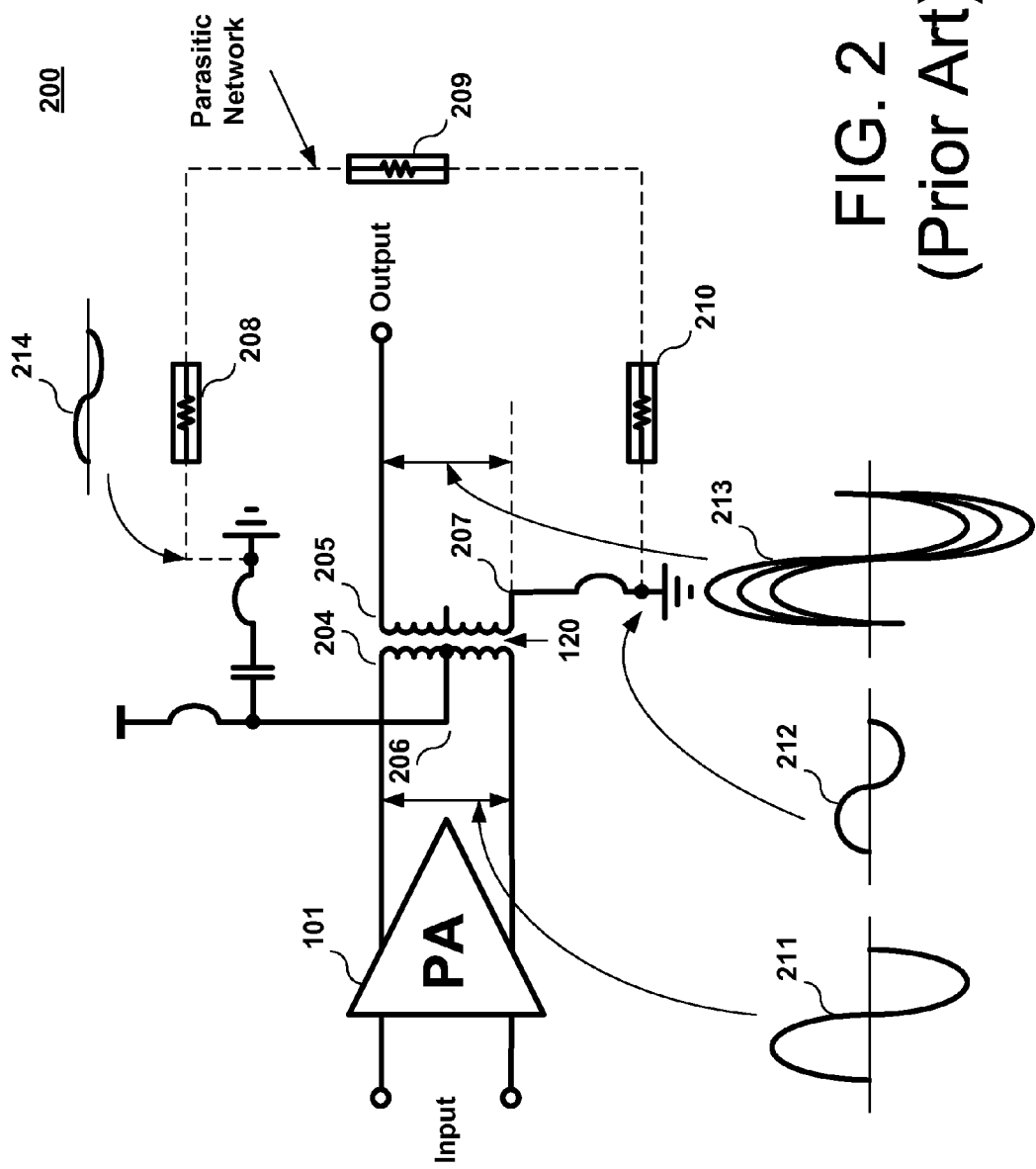

FIG. 2 illustrates a transformer output matching of a conventional power amplifier system.

Figure 3:
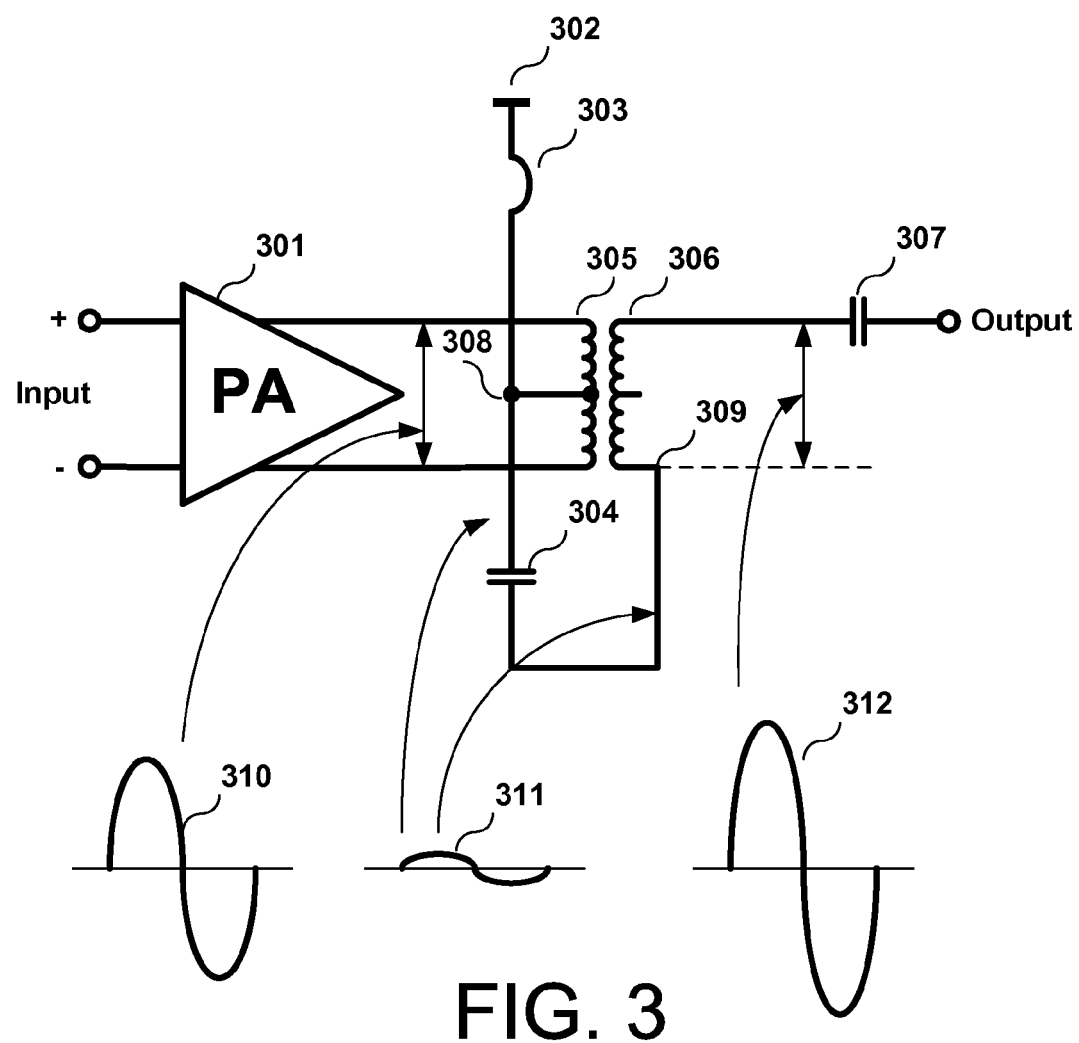

FIG. 3 illustrates an example embodiment of the invention in which the reference of the primary winding is fed to the reference point of the secondary winding, according to an example embodiment of the invention.

Figure 4:
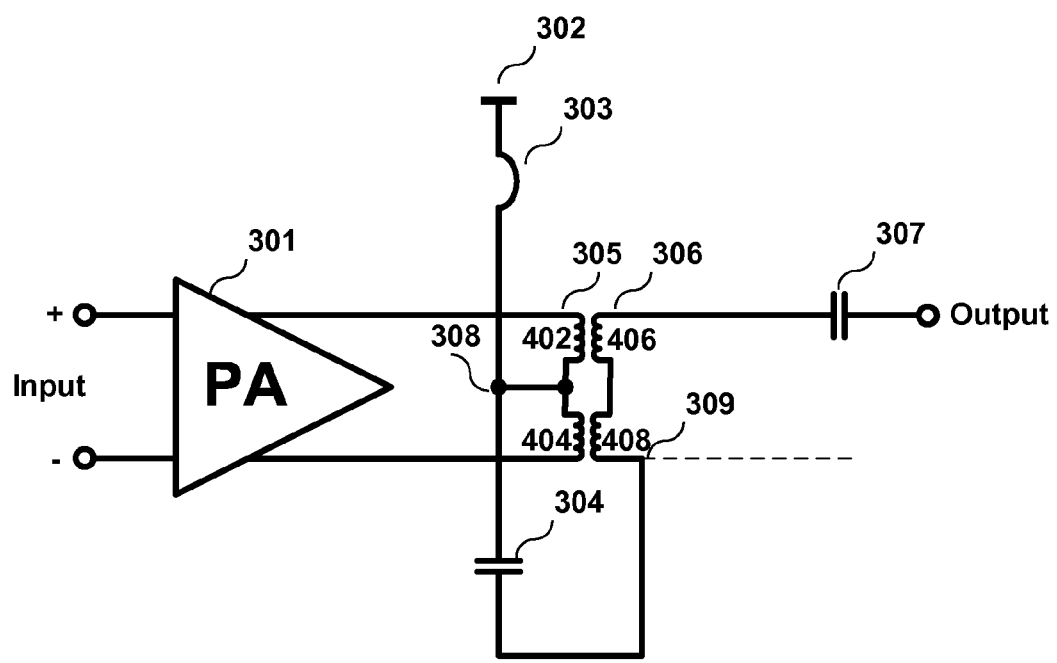

FIG. 4 illustrates an example variation of the embodiment of FIG. 3 in which multiple segments or windings are utilized to implement one or both of the primary winding or the secondary winding, according to an example embodiment of the invention.

Figure 5:
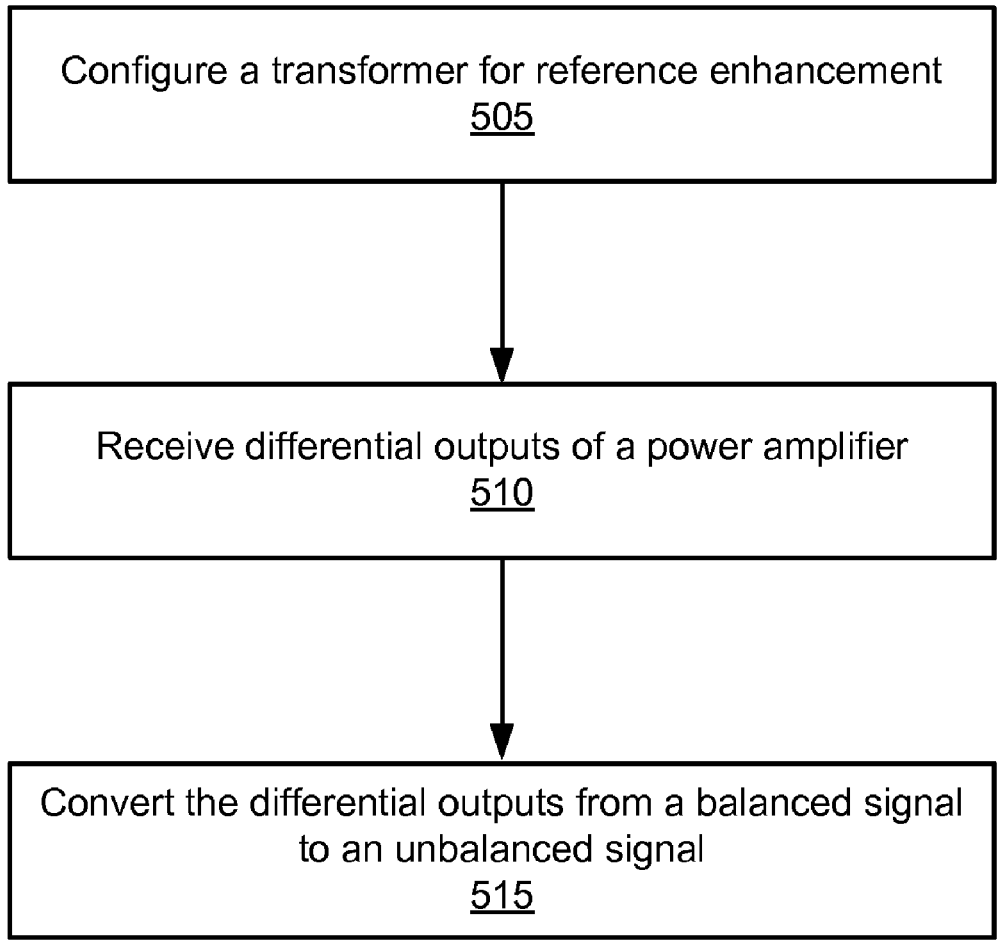

FIG. 5 illustrates an example method for utilizing a common-reference transformer in accordance with an example embodiment of the invention.

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIG. 3 illustrates an example power amplifier system 300 that utilizes a common-reference balun, according to an example embodiment of the invention. One or all of the components of the power amplifier system 300 may be implemented as an integrated circuit, perhaps as part of a CMOS substrate, according to an example embodiment of the invention. In general, an example common-reference balun may feed a reference of the primary winding to a reference of a secondary winding, thereby providing a common reference for both windings, according to an example embodiment of the invention. The existence of a common reference between the primary winding and the secondary winding may reduce loss when converting the balanced output of the power amplifier at the primary winding to an unbalanced output at the secondary winding, according to an example embodiment of the invention. Likewise, the use of a common reference between primary winding and the secondary winding may reduce fluctuations in the single-ended output based upon noise present in either or both of the primary winding and secondary winding, according to an example embodiment of the invention.

With further reference to FIG. 3, an example common-reference balun may be implemented using a transformer 320 having at least one primary winding 305 that is inductively coupled to at least one secondary winding 306. Each of the two respective ends or ports of the primary winding 305 may be connected to respective differential output ports of a power amplifier 301, which may be a CMOS power amplifier according to an example embodiment of the invention. According, the primary winding 305 may receive a balanced output signal from the power amplifier 301. The primary winding 305 may also include a center tap port that is connected to a DC bias 302 via an RF choke 303. The DC bias may be fed through the center tap port for biasing one or more components of the power amplifier 301, according to an example embodiment of the invention. The secondary winding 306 may have a first end or port (e.g., single-ended port) that is connected to the system output port via an intervening capacitor 307, which may be a DC blocking capacitor or other DC blocking element, according to an example embodiment of the invention. Thus, the system output port may provide an unbalanced signal resulting from the balanced-to-unbalanced conversion provided by the transformer 320 configured as a balun.

To minimize loss from the balanced-to-unbalanced conversion by the transformer 320, the reference of the primary winding 305 may be fed via one or more electrical connections to a reference of the secondary winding 306, according to an example embodiment of the invention. The electrical connections may be implemented using metallic traces, according to an example embodiment of the invention. As shown in FIG. 3, a vague common reference can be enforced by electrically connecting the first reference 308 of the primary winding 305 with the second reference 309 of the secondary winding 306 via a capacitor 304, which may be operative as a DC blocking capacitor, according to an example embodiment of the invention. Instead of a capacitor 304, another type of DC blocking element such as a bank of capacitors can be utilized without departing from example embodiments of the invention. The first reference 308 can obtained via a center tap port of the primary winding 308 while the second reference 309 can be obtained from a second end or port of the secondary winding 309, according to an example embodiment of the invention. Accordingly, the PA output signal 310 (e.g., the balanced signal) on the primary winding 310 can share a common reference with the signal 312 (e.g., the unbalanced signal) on the secondary winding 312. Given this shared common reference, external noise 311 may not materially affect the coupling between the primary winding 305 and the secondary winding 306. Accordingly, the output signal 312 at the single-ended port of the secondary winding 306 may have no or minimal fluctuation due to the external noise 311.

It will be appreciated that the center tap port described above is sometimes, but not always, located in the center of the primary winding 308. Indeed, the center tap port could alternatively vary from the exact center without departing from example embodiments of the invention.

FIG. 4 illustrates a variation of FIG. 3 in which an example common-reference transformer can be implemented using multiple segments or windings for or both of the respective primary and secondary windings. As shown in FIG. 4, the primary winding 305 may be comprised of at least a first segment or winding 402 and a second segment or winding 404. More specifically, a first send of the first segment or winding 402 may be connected to a first differential output of the PA 301. A second end of the first segment or winding may be connected to a first end of the second segment or winding 404, and a second end of the second segment or winding 404 may be connected to a second differential output of the PA 301. In a similar fashion, the secondary winding 306 may likewise be comprised of a first segment or winding 406 and a second segment or winding 408. A first end of the first segment or winding may provide, via the signal-ended port, the output signal, which may be processed by a DC blocking capacitor 307 or other DC blocking element prior to being taken as the system output. The second end of the first segment or winding 406 may be connected to a first end of the second segment or winding 408. The second end of the second segment or winding 408 may provide the second reference 309 for the secondary winding 306. The first reference 308 for the primary winding may be obtained from a port or tap that is located between the first segment or winding 402 and the second segment or winding 404. Accordingly, a common reference can be enforced by connecting the first reference 308 of the primary winding 305 with the second reference 309 of the secondary winding 306, according to an example embodiment of the invention.

FIG. 5 illustrates a method for utilizing a common-reference transformer in accordance with an example embodiment of the invention. At block 505, a transformer may be configured for common-reference enhancement in accordance with an example embodiment of the invention. As described herein, a transformer may have at least a primary winding and a secondary winding. The primary winding may also include a center tap that is connected to a DC bias source. The secondary winding, which is inductively coupled to the primary winding, may include a first port and a second port, where the first provide provides an output signal (e.g., a single-ended, unbalanced signal). The configuration of the transformer may include electrically connecting the second port of the secondary winding with the center tap of the primary winding. In addition, a capacitor such as a DC blocking capacitor or other element may be positioned between the second port of the secondary winding and the center tap of the primary winding. It will be appreciated that the transformer may be configured similarly to the transformers described in FIG. 3 or 4, discussed above.

Following the configuration of the transformer 505, the differential outputs may be provided from a power amplifier to the primary winding of the transformer, as illustrated by block 510. In block 515, the primary winding may be inductively coupled to the secondary winding of the transformer. As such, the transformer can convert the received PA differential outputs from a balanced signal to an unbalanced signal, where the unbalanced signal may be provided at the first port of the secondary winding. A DC blocking capacitor or element can be applied to the output of the first port of the secondary winding in order to obtain the system output.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A power amplifier system, comprising:
a power amplifier having differential outputs;
a transformer having at least a primary winding and a secondary winding, wherein the primary winding is connected to the differential outputs of the power amplifier, wherein the primary winding includes a center tap, wherein the secondary winding that includes a first port and a second port, the first port for providing a system output; and
an electrical connection that connects the center tap of the primary winding with the second port of the secondary winding.

2. The system of claim 1, wherein the electrical connection includes a capacitor positioned between the center tap of the primary winding with the second port of the secondary winding.

3. The system of claim 2, wherein the capacitor operates as a DC blocking capacitor.

4. The system of claim 1, wherein the differential outputs of the power amplifier form a balanced signal, wherein the system output is an unbalanced signal, wherein the transformer is a balun that is operative to convert the balanced signal to the unbalanced signal.

5. The system of claim 1, wherein the power amplifier is a CMOS power amplifier.

6. The system of claim 1, wherein a DC block capacitor is provided between the first port of the secondary winding and the system output.

7. The system of claim 1, wherein the electrical connection provides a common reference for both the primary winding and the secondary winding.

8. The system of claim 7, wherein the common reference enables the transformer to convert the differential outputs from a balanced signal to an unbalanced signal available at the first port while mitigating fluctuations in the unbalanced signal due to noise.

9. The system of claim 1, wherein the primary winding comprises at least a first segment or winding and a second segment or winding that are configured in series, wherein the center tap of the primary winding is positioned between the first segment or winding and the second segment or winding.

10. The system of claim 1, wherein the center tap is further connected to a DC bias source.

11. A method, comprising:
configuring a transformer having at least a primary winding and a secondary winding for reference enhancement, wherein the primary winding includes a center tap, wherein the secondary winding includes a first port and a second port, wherein the configuration includes electrically connecting the second port and the center tap of the primary winding to provide a common reference for the reference enhancement;
receiving differential outputs of a power amplifier by the primary winding of the transformer; and
converting, by the transformer, the differential outputs from a balanced signal to an unbalanced signal available at the first port of the secondary winding.

12. The method of claim 11, wherein the center tap of the primary winding with the second port of the secondary winding are electrically connected via a capacitor.

13. The method of claim 12, wherein the capacitor operates as a DC blocking capacitor.

14. The method of claim 11, wherein the power amplifier is a CMOS power amplifier.

15. The method of claim 11, further comprising:
connecting a DC block capacitor to the first port of the secondary winding, wherein a system output is obtained via the DC block capacitor.

16. The method of claim 11, wherein the common reference enables the transformer to convert the differential outputs from a balanced signal to the unbalanced signal available at the first port while mitigating fluctuations in the unbalanced signal due to noise.

17. The method of claim 11, wherein the primary winding comprises at least a first segment or winding and a second segment or winding that are configured in series, wherein the center tap of the primary winding is positioned between the first segment or winding and the second segment or winding.

18. The method of claim 11, wherein the center tap is further connected to a DC bias source.

19. A system, comprising:
a transformer having at least a primary winding and a secondary winding for reference enhancement, wherein the primary winding includes a center tap, wherein the secondary winding includes a first port and a second port;
an electrical connection that electrically connects the second port and the center tap of the primary winding to provide a common reference for the primary winding and the secondary winding;
wherein the primary winding of the transformer is configured to receive differential outputs of a power amplifier; and
wherein the transformer is configured to convert the differential outputs from a balanced signal to an unbalanced signal available at the first port of the secondary winding.

20. The system of claim 19, wherein the electrical connection includes a capacitor or bank of capacitors positioned between the center tap of the primary winding with the second port of the secondary winding.

* * * * *